(12) United States Patent
Baker et al.

(10) Patent No.: US 8,187,003 B2
(45) Date of Patent: May 29, 2012

(54) METHOD AND APPARATUS FOR RAPID SURVEYING OF STATIC STRUCTURES

(75) Inventors: Tracy Baker, Mantua, NJ (US); Todd Weidner, Oaklyn, NJ (US); Brian Schneider, Barrington, NJ (US); Thomas Davis, Delran, NJ (US); Randy Riesenberg, Gwynedd, PA (US)

(73) Assignee: BRT Technologies, LLC, Mantua, NJ (US)

( * ) Notice: Subject to any disclaimer, the term of this patent is extended or adjusted under 35 U.S.C. 154(b) by 887 days.

(21) Appl. No.: 12/055,884

(22) Filed: Mar. 26, 2008

(65) Prior Publication Data

US 2008/0244436 A1  Oct. 2, 2008

Related U.S. Application Data

(60) Provisional application No. 60/908,489, filed on Mar. 28, 2007.

(51) Int. Cl.
*G09B 25/00* (2006.01)
(52) U.S. Cl. ............... 434/72; 52/49; 52/160; 715/771
(58) Field of Classification Search .......... 434/72; 52/49, 160; 715/771
See application file for complete search history.

(56) References Cited

U.S. PATENT DOCUMENTS

2009/0037834 A1*  2/2009  Parrish .................. 715/771

OTHER PUBLICATIONS

William Deddis, Development of a geographic information system for mass appraisal of residential property, Nov. 2002, RICS Education Trust, 1-21.*

* cited by examiner

*Primary Examiner* — Xuan Thai
*Assistant Examiner* — Banafsheh Hadizonooz
(74) *Attorney, Agent, or Firm* — Caesar, Rivise, Bernstein, Cohen & Pokotilow, Ltd.

(57) ABSTRACT

An apparatus to facilitate field assessment of static structure sites to provide data in a predetermined format acceptable to a taxing authority, including a personal computing device having a graphic display screen, a user interface, and application software. The user interface is arranged to accept alphanumeric data provided by a user of the apparatus and also accept graphic input from the user representative of structural features of the static structure. The application software is arranged to provide a real-time display on the graphic display screen of dimensional data associated with the graphic inputs as they are entered by the user. The application software is also arranged to compute dimensional attributes of enclosed polygons resulting from the graphic input by the user.

14 Claims, 6 Drawing Sheets

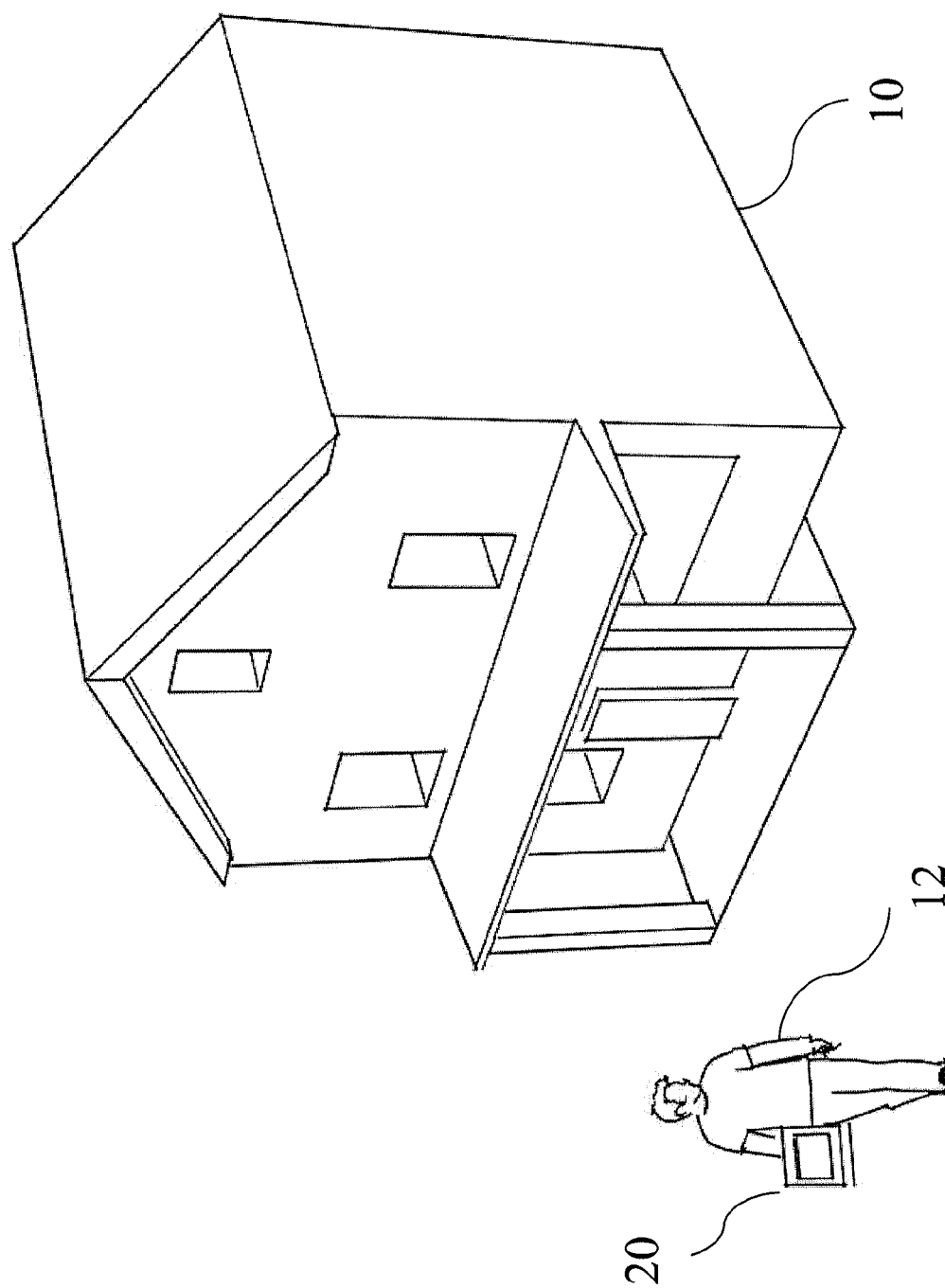

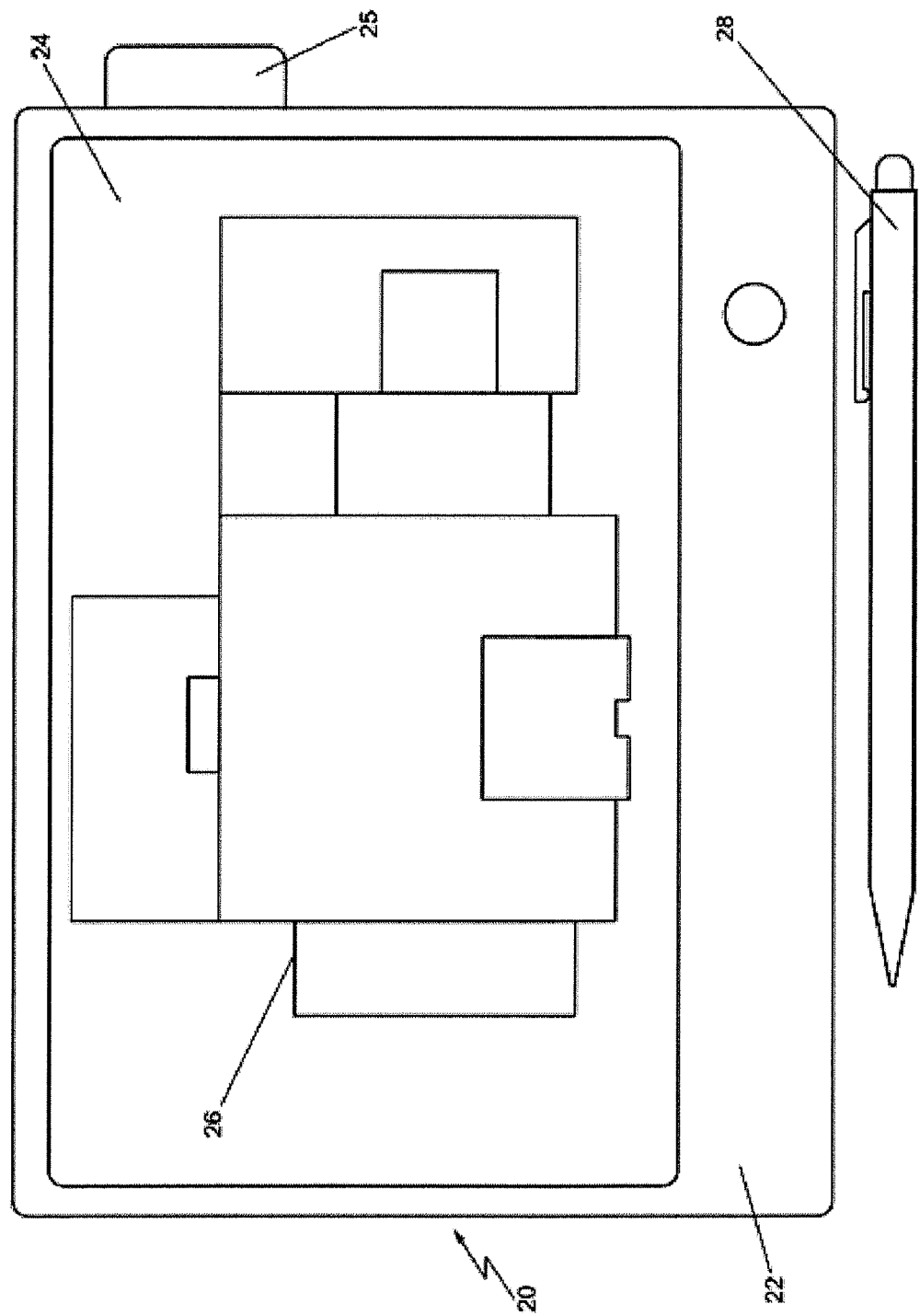

METHOD AND APPARATUS FOR RAPID SURVEYING OF STATIC STRUCTURES

BACKGROUND OF THE INVENTION

This invention relates generally to the surveying of static structures, such as buildings, and more particularly surveying such structures for real estate tax assessment purposes.

DESCRIPTION OF THE PRIOR ART

Today, a real estate tax assessor typically collects survey information with pencil and paper. He visits the site, examines the property, and records data about the site and buildings thereon. Typically the assessor manually records data onto a paper property record card in three steps. First, the assessor collects various pieces of basic data about the property. Next he sketches the dimensions of the property onto a grid that is preprinted on the card. Finally, he asks the site owner to sign the card.

Some automated field drafting systems exist today. These systems lack advantages of the present invention. To understand a typical prior art automated field drafting system, consider the process that might be required in the drafting of a structure having four adjacent rectangular rooms laid out in an array of two rows and two columns. To draw this structural layout, the assessor is required to draw the four lines defining a first room, then the four lines defining a second room (even though those two rooms share a common wall), four lines for the third room (even though it shares a common wall with its first room), and finally four lines for the last room (even though it shares common walls with the second and third room). This requires the assessor to draw sixteen individual lines to represent these four rooms. It also requires that each room be drawn and completed independently before the next room can be drawn. This process, as implemented in previous automated field drafting systems does not accurately reflect the methods of assessors doing their work manually with pencil and paper. Further, it is error-prone as each room is drawn without reference to the others.

The known process of field drafting is also prone to several other types of errors and related problems. Encoding errors occur when the assessor draws the sketch with incorrect measurements. In this event, the drawing will not square and the resultant data will be unacceptable to the taxing authority. Transcription errors occur when a sketch is improperly interpreted by an encoder manually entering data representing the sketch. This may occur due illegible writing or sketching by the assessor, or simple entry mistakes by the encoder. With this type of error, resultant data may either be unacceptable to the taxing authority or may be accepted while consisting of incorrect data. These errors may also be recognized by the encoder, raising the problem of rework, in which the encoder must return the property record card to the assessor, who in turn must return to the property and redo the work. These problems result in losses of both time and money for assessors and may result in improper tax assessments for property owners.

BRIEF SUMMARY OF THE INVENTION

The subject invention is directed to an apparatus designed to facilitate field assessment of static structure sites, and to further provide data in a predetermined format acceptable to a taxing authority. The apparatus includes a personal computing device having a graphic display screen, a user interface, and application software. The user interface is arranged to accept alphanumeric data provided by a user of the apparatus and also accept graphic input from the user representative of structural features of the static structure. The application software is arranged to provide a real-time display on the graphic display screen of dimensional data associated with the graphic inputs as they are entered by the user. The application software is also arranged to compute dimensional attributes of enclosed polygons resulting from the graphic input by the user, and to provide this information in at least one format compatible with at least one taxing authority.

BRIEF DESCRIPTION OF THE FIGURES

FIG. 1 is an illustration showing a user of the system with the subject invention at the location of a personal residence to be assessed;

FIG. 1*a* is a top plan view of an exemplary personal computing device forming a portion of the system shown in FIG. 1;

DETAILED DESCRIPTION OF PREFERRED EMBODIMENTS OF THE INVENTION

Referring to FIG. 1, the subject invention is directed to a system 20 designed to facilitate field assessment by a user 12 of static structure sites, e.g. a private residence 10 to provide data in a predetermined format acceptable to a taxing authority.

Figure 2:
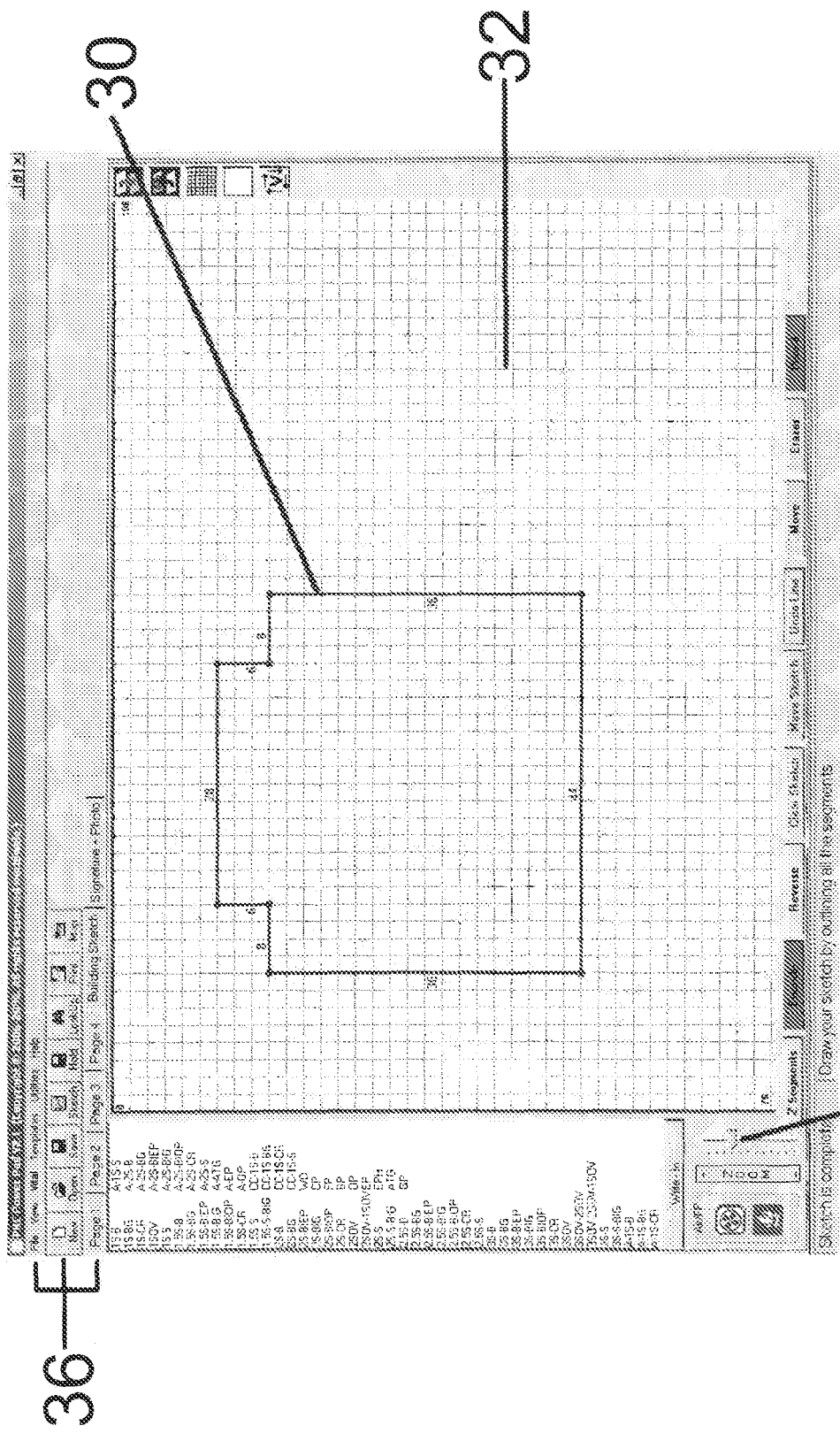
FIG. 2 is an illustration of a portion of the display of the personal computing device shown in FIG. 1*a* in the process of having lines drawn thereon representative of the floor plan of a building being assessed.
Figure 3:
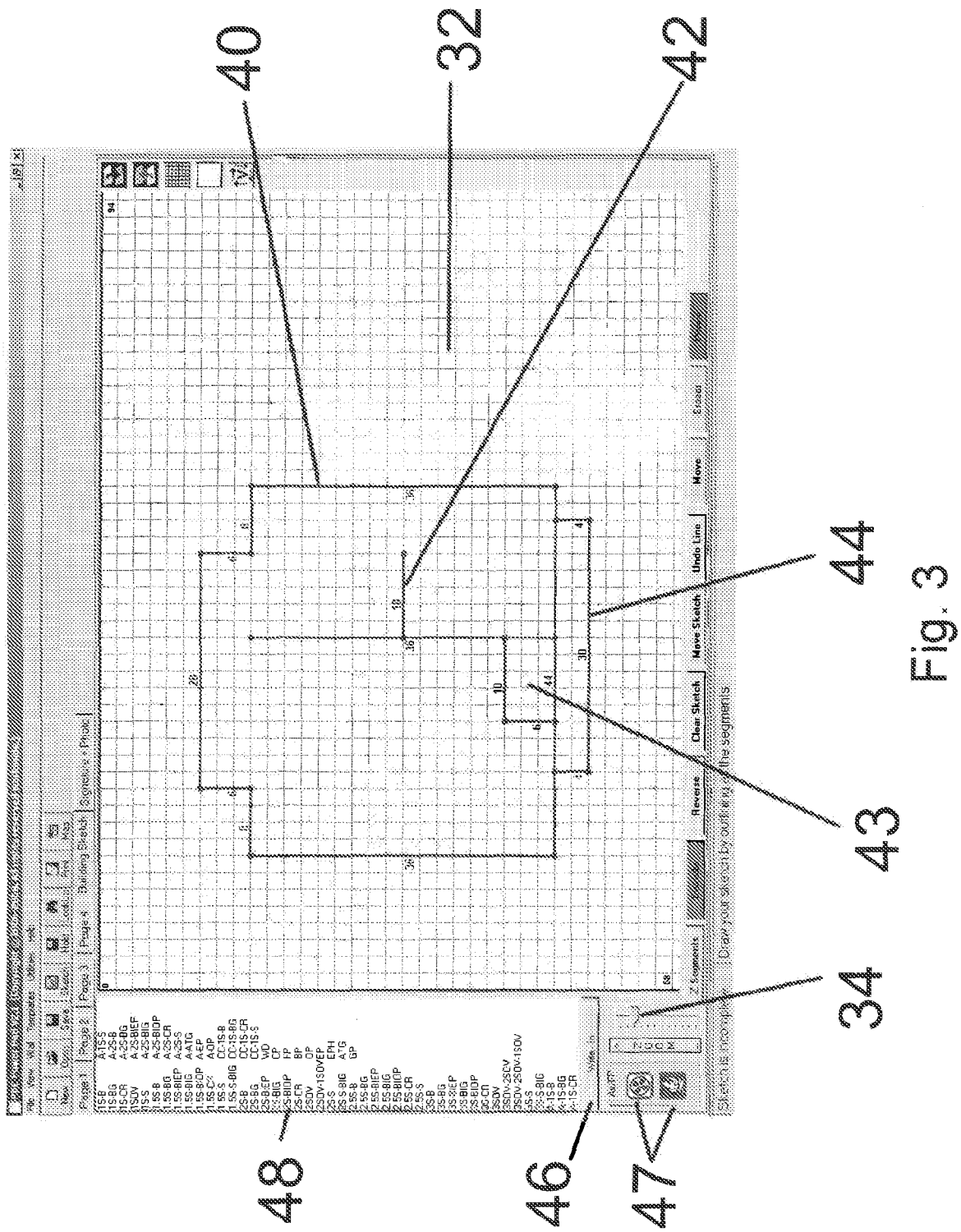
FIG. 3 is an illustration similar to that of FIG. 2 but showing additional lines being added to the floor plan.
Figure 4:
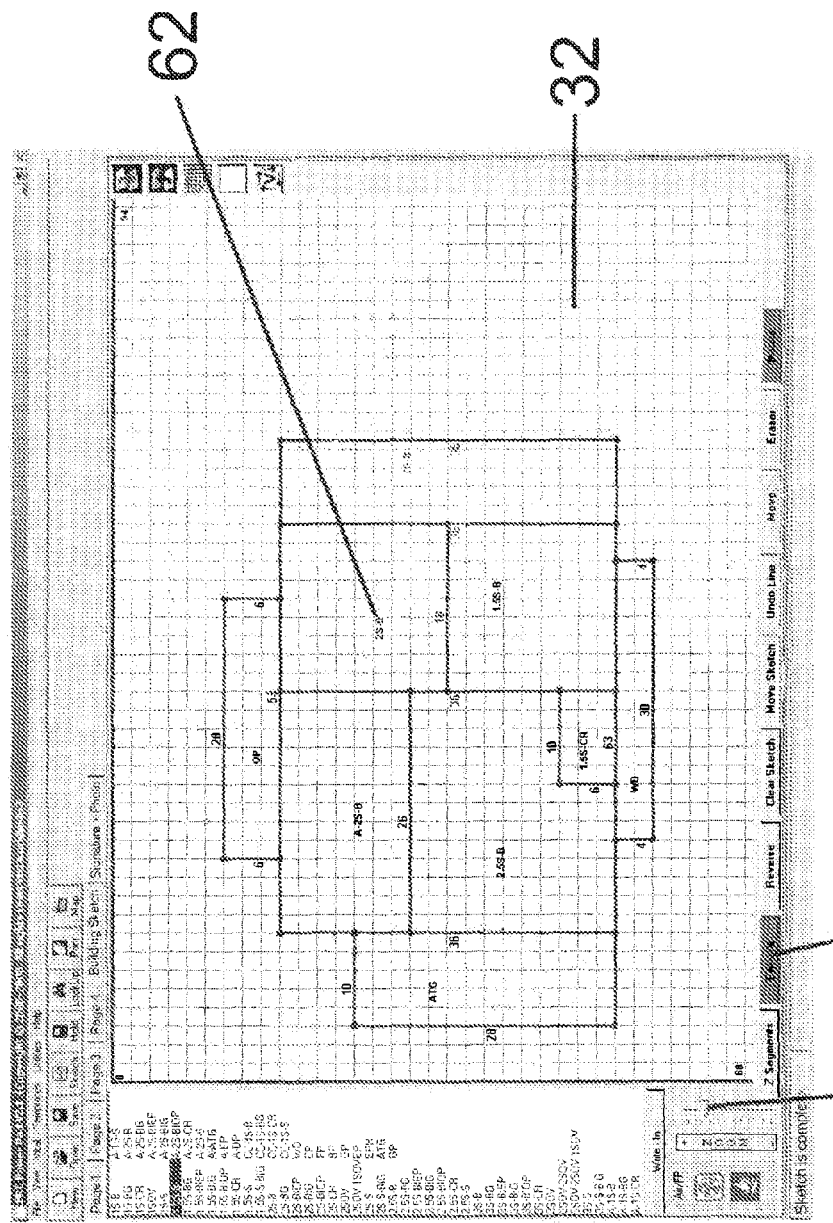
FIG. 4 is an illustration similar to that of FIGS. 2-3 but showing additional lines being added to the floor plan.

In a first preferred embodiment, the system 20 includes an apparatus 22, shown in the exemplary FIG. 1 and FIG. 1*a* as a personal computing device, having a graphic display screen 24, a user interface 26, and application software running on the apparatus. Non-limiting examples of the apparatus 22 include a laptop computer, tablet computer, personal digital assistant ("PDA") etc. The user interface 26, shown in FIG. 1*a*, is arranged to accept alphanumeric data provided by a user of the apparatus 22 and also accept graphic input from the user representative of structural features of the static structure 10. An example of a graphic display screen 24 in use to accept graphic input is depicted in FIGS. 2, 3, and 4. The user interface 26 is also arranged to accept input through button, drop-down boxes, select boxes, and other user interface components.

In the preferred embodiment, the apparatus 22 further includes a user input pointing device 28. In the preferred embodiment, the display screen 24 also serves as a graphic input device receiving input from the input pointing device 28. Typically this would be accomplished using a tablet style personal computer with an input stylus. However, the invention could be embodied in any number of computing device formats, non-limiting examples of which include notebook computers, desktop computers, handheld computers, cell phones, personal digital assistants, etc., any of which may be provided with a pointing input device such as a stylus, mouse, trackball, touch screen, or their equivalents. While the preferred embodiment is designed to take input without the need for a keyboard, a keyboard may be included for input purposes. In one embodiment, an on-screen "virtual" keyboard is included in the system software allowing user to type text entries using the input pointing device to interact with the keys of the on-screen keyboard.

Referring now to FIG. 1a, an exemplary embodiment of the subject invention is shown, comprising an apparatus 22 in the form of a tablet computer, having a graphic display screen 24. The graphic display screen 24 displays the user interface 26 of the system software. The exemplary embodiment includes a pointing device 28 in the form of a stylus for user input without the need for a keyboard. The exemplary apparatus further includes a wireless network adapter 25 allowing connectivity to remote systems. While the preferred embodiment of the subject invention includes wireless capability, the system may be implemented using non-networked devices or devices requiring wired connectivity.

The application software is arranged to provide a real-time display on the graphic display screen 24 of dimensional data associated with the graphic inputs as they are entered by the user. The application software is also arranged to compute dimensional attributes of enclosed polygons resulting from the graphic input by the user, and to provide this information in at least one format compatible with at least one taxing authority.

Referring now to FIG. 2, there is shown an illustration of an exemplary screen of one exemplary apparatus constructed in accordance with this invention in the process of having lines drawn thereon representative of the exterior of a building being assessed. This preferred embodiment of the user interface 26 graphically displays dimensional data 30 associated with user input. This dimensional data 30 corresponds to collected measurements of the static structure being assessed by the user of the system 20. The major area displays a grid 32 on which the user may draw the subject building. In this example, the grid is in two-foot increments, and a sketch of the perimeter of a static structure floor plan 30 is shown. In the top margin of the user interface 26 are several rows of command words and command buttons 36, including options to view other sketches related to the same static structure, or to proceed to the entry of items such as signatures and photographs.

FIG. 3 further illustrates the graphical display of dimensional data 40. The data collection screens in the preferred embodiment allow the user to enter and graphically represent free standing walls 42 as well as enclosed spaces 43. This is an improvement over existing systems and more accurately conforms to the method of surveying structures typically employed by a tax assessor than prior systems, allowing the assessor to draw walls in a convenient order rather than forcing completion of a single enclosed space. This improvement within the subject invention therefore improves the efficiency with which the user may record the collected data. FIG. 3 depicts lines being added to the static structure floor plan show in FIG. 2. FIG. 3 shows the addition of three lines to represent an exterior addition 44 to the building perimeter. In addition, several interior walls of the building have been drawn to create an enclosed interior space (room) 43 and unenclosed interior space delineations (walls). The preferred embodiment allows the user to add structural additions 44 to the existing sketch by drawing only the additional walls, without requiring the user to redraw the shared wall or walls. Similarly, the free standing walls 42 may be continued in length or incorporated in the drawing of enclosed spaces. This is indicative of the capability of the present system to sketch such walls as they are measured, rather than upon the completion of all measurements of each room.

To facilitate the continuation of existing drawing elements, the preferred embodiment includes a line continuation feature, whereby the system will analyze multiple lines as they are drawn, regardless of how they are entered. If two lines are parallel and overlap, the system will connect them into a single line. This allows the assessor to easily extend existing lines without the need to redraw or edit the original lines.

In a further aspect of the preferred embodiment, allowing the assessor to work quickly and in a manner natural to the task at hand, the system is arranged to accommodate entry via means convenient to the personal computing device. In particular, alphanumeric data fields are designed so that they do not require the use of a keyboard. Rather, combo boxes or drop down boxes are used for most fields. Combo boxes are elements of a graphical user interface that provide both space for the entry of a line of data and a drop-down selection list of typical entry choices. Where numeric input is required, a unique calculator dropdown has been created so that the assessor may simply tap in the number with the input pointing device 28. In the few instances where free text entry is required, the invention may utilize the handwriting recognition software built into many portable personal computing devices. Examples of free text writing include but are not limited to the street address of the assessed site, the owner of the site, and associated contact information. As shown in FIG. 3, the preferred embodiment of the user interface 26 provides in the left margin common labels 48 which may be dragged onto sketch items. The preferred embodiment further includes a "write in" button 46, which when clicked, causes the software to present a box to accept the free text entry allowing the creation of user-defined labels. Further, the preferred embodiment of the user interface 26 displays two exemplary icons that may be added to the drawing by pressing structural element buttons 47 which bear images of common elements such as fireplaces and air conditioners. Clicking a structural element button 47 allows the user to easily add the represented structural element to the drawing. Structural element buttons 47 may be included for any common feature of surveyed structures and are not limited to the aforementioned examples. The number of displayed structural element buttons 47 need not be limited to two.

The preferred embodiment of the invention comprises special methods for the entry of graphic data. Using these methods, the assessor draws or erases lines or other graphic elements exactly as he would on a piece of paper. There are no restrictions on where a line is drawn, how long the line can be, or at what angle it may be drawn. Input by the assessor is aided by automatic display in real time of the length of each graphic element as it is drawn. Thus, the assessor may draw a line of exactly the length he needs without guessing or estimation. In the case of diagonal lines, the application software of the preferred embodiment shows the rise-over-run dimensions of the angled line as it is being drawn. This removes guesswork from the freehand drafting of angles.

The preferred embodiment further comprises a snap-to-grid feature, holding drawn lengths to fixed increments and fixed angles. In the example of FIG. 2-5, the grid 32 of the selected screens displays and optionally enforces entry on a scaled grid. The grid shown in the exemplary FIG. 2-5 represents a two-foot scale. The scale represented by the grid is controlled in the preferred embodiment by a zoom slider and/or zoom button 34 in the bottom left corner of the exemplary user interface 26 which the user employs to select the desired magnification of the drawing. The system may be configured to snap the start and end points of all graphic elements to the nearest point on the two-foot grid and to cause the line drawn to precisely follow the grid line.

Similarly, the system may optionally incorporate a snap-to-lines feature, whereby the start and end points of new graphic elements are automatically moved to join nearby, previously entered graphic elements.

FIG. 4 is a still further illustration of an exemplary screen of one exemplary apparatus in accordance with this invention. FIG. 4 illustrates a completed sketch, i.e., one in which all spaces are defined to the extent necessary for the computation of an assessment. In the example depicted, all rooms bear user-selected labels 62.

Figure 5:
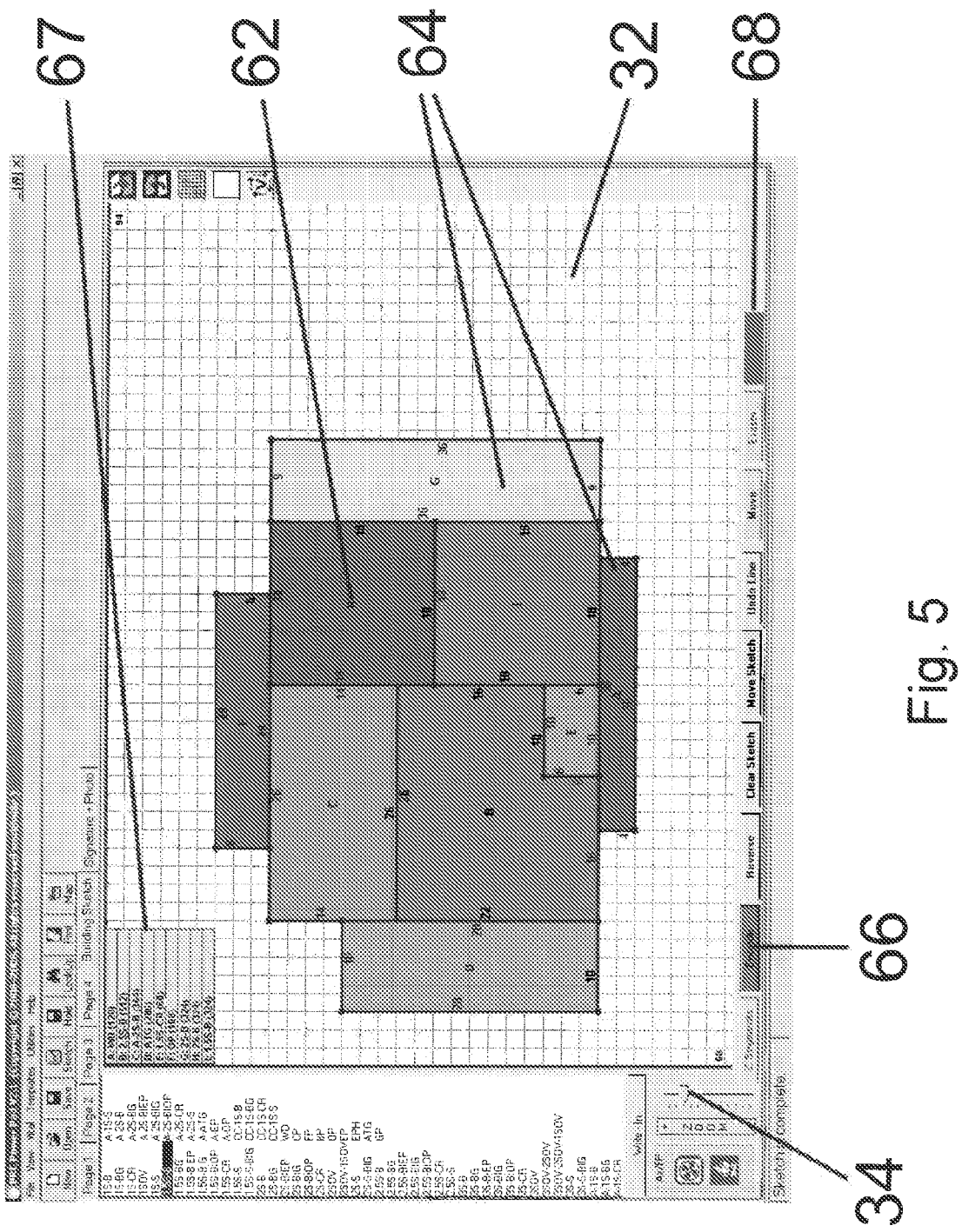
FIG. 5 is an illustration of a completed display of the floor plan of the building.

As shown in FIGS. 4 and 5, the preferred embodiment allows the user to place the user-selected labels 62 in any area of the sketch to display coded descriptive data strings for each structural element, representing the type of space drawn. Entry of such data allows the user to define the three dimensional aspects of the drawn space, such as number of stories and location above or below ground level, as well as other representative features. The visual display of the descriptive data strings may be enabled or disabled at any time by the user. As described above, the system allows the user to enter user-defined descriptive strings as well.

In a further aspect of the preferred embodiment, to ensure proper data collection, various edit checks are built into the application software. These edit checks ensure "clean" data output from the encoding, which will be acceptable by Computer Aided Mass Assessment (CAMA) systems, thereby reducing the human interaction necessary to correct errors that may occur in paper-and-pencil assessment and manual entry of encoding information. For instance, anytime a section allows the entry of a percentage, the edit check functionality of the system software ensures that the entries for all relevant items add up to 100%. For example, when entering the percentage areas of subsections of an enclosed space, if the total of subsection entries for the selected section exceeds 100%, the section turns red notifying the assessor that something is wrong. Similarly, when a section is deselected, then inappropriate fields are automatically disabled.

The edit checks of the present invention help to avoid drafting errors, which often occur when assessors use paper and pencil. In manual systems it is up to the assessor to make sure all rooms are completed and that all measurements are correct. Failure to do so is problematic for human encoders who, later, will have to convert such pencil drawings into formats recognized by CAMA systems. For example, it is easy for an assessor, using a pencil, to mistakenly draw a perfect square but then label the sides with lengths of 10, 10, 10, and 12. Conversely, a human encoder might mistakenly enter 10, 10, 10, and 12 when the assessor had correctly given square dimensions. The edit checks built into the present invention avoid such problems of human dimensional encoding and transcription errors and associated rework. The system will prevent the user from encoding and/or uploading data that does not meet the checks built into the software's edit check. In the event that erroneous entries are made, the system presents an indication to the user alerting the user to the improperly entered graphical or numerical element visually with text or graphics and/or audibly.

As shown in FIG. 4, the preferred embodiment of the user interface 26 presents a disabled button while drawing elements are incomplete. Referring now to FIG. 5 the user interface 26 displays an enabled Encode Ready button 66 when all drawing elements have been properly completed. Clicking the enabled Encode Ready button 66 will generate encoded data suitable for submission to at least one specified taxing authority's CAMA system or other electronic data collection system. The user interface 26 may include other buttons on one or more toolbars 68 for one-button access to other software functionality. Such functionality may include, but is not limited to, uploading data to another system, reversing (mirroring) the sketch, clearing or moving the sketch, moving selected objects within the sketch, undoing the last operation, and activating an eraser tool.

In a further feature of the preferred embodiment, the system software checks relationships between fields and the sketch to detect errors. If, for example, a field is checked specifying that the surveyed structure includes a basement, a basement must be included in the sketch before the system will allow encoding of the sketch. If there is a discrepancy between the sketch and fields, the system may alert the user visually with text or graphics and/or audibly, informing the user that the error must be corrected. The preferred embodiment similarly checks relationships between the individual fields and may alert the user to inconsistencies or errors.

The preferred embodiment includes a sketch completion analysis feature, whereby the system will continuously perform edit checking, not limited to those described in the prior paragraph, and validate the drawing in real time as it is drawn. A completed drawing is one where all polygons are closed. As the assessor draws the sketch, it is analyzed. When a sketch is complete, an indication, such as a graphical user interface button, will signal the completion to the assessor. If another line segment is added which creates an open polygon, such indication could be removed to indicate that the drawing is not complete. Similarly, if the sketch is incomplete, the assessor may be blocked from performing functions which are appropriate only for completed sketches.

The preferred embodiment includes a sketch analysis feature, whereby the system will analyze all line segments drawn and determine the exact measurements of each polygon in the completed sketch. The sequence of lines made when drawing the sketch is irrelevant and only the final drawing is considered. The following example illustrates the importance of the sketch analysis feature. In sketching a four-room dwelling, the assessor may first draw a square creating one square room, bisect the square with a horizontal line creating two rectangular rooms, and next bisect the lower rectangle with a vertical line to create three rooms. By attaching a small square to the right side of the drawing, the assessor creates the fourth room. As each room in the foregoing example has been created by assembling line segments, one at a time, the number of permutations of drawing steps that used to create these four rooms is high. Despite this fact, CAMA databases require only the number and sizes of the rooms regardless of the actual drafting sequence and. The preferred embodiment of the sketch analysis feature allows the sketch to be completed in any of the possible methods and computes and encodes the resultant data upon completion of the sketch.

FIG. 5 is an illustration of an exemplary screen of one exemplary apparatus in accordance with this invention in which the results of an automated analysis of the graphic data is presented to the user in a color-coded fashion. In this example, the system has added computed data 67 to the user selected labels. In this case, the computed square area enclosed in each room or subsection is given in parentheses.

As shown in FIG. 5, once a sketch has been analyzed, the polygons are color-coded 64. This embodiment takes into account the possibility that the assessor may be color blind, including the most common type, red-green color blindness. The colors used in the preferred embodiment of the present system are therefore chosen specifically to be unambiguous to colorblind assessors.

In the preferred embodiment, the present system encodes the analyzed polygons to compute data for use by a CAMA database. Various encoding algorithms are included to support a number of such databases. Once encoded, the data is readily uploaded directly to a CAMA database. As shown in FIG. 5, the preferred embodiment also computes and displays the measured area 67 of the drawn spaces. Display of the computed area may utilize American National or metric units, the choice of which may be configurable by the user in the software of the system.

In the preferred embodiment, the present system can upload both data and sketch information in a number of ways. Transport can be by a batch file, whereby data for multiple properties are collected and submitted, or by a direct connection, whereby a single property's data is submitted either at the completion of the assessment of that property or at a later time. Both wired and wireless connectivity may be supported for transport and other necessary exchanges of data.

A variety of features may be incorporated in alternative embodiments of the invention. These may include many features common to graphical user interface sketching application programs, such as, but not limited to, a pencil tool, and eraser tool, and commands to move or mirror the image, and undo changes and zoom in and zoom out. The assessor may drag and drop room descriptions from a pre-selected list, or create a new description ad hoc. Icons may be provided to label major features such as, but not limited to, fireplaces and air conditioners.

Other embodiments of the invention may optionally incorporate other features useful to the field assessment process. Non-limiting examples of these features are signature capture and photo capture.

In the example illustrated in FIGS. 2-5, all graphic data elements are rectilinear. However, as mentioned above the invention encompasses straight lines drawn at any angle. Further, other graphic elements, such as curved lines and circles, would be readily accommodated in other embodiments of the invention not shown in the figures.

EXAMPLE

In practice, typically an assessor will walk around the outside of the house measuring and sketching the exterior dimensions. Using the present invention, the assessor simply draws lines on the screen lines depicting the exterior walls of the home, as depicted in the example of FIG. 2. Similarly, exterior extensions may be added easily. FIG. 3 depicts an example of the addition of a porch requiring the assessor to draw only three more lines on the screen: a single 30-foot line and 2 four-foot lines. The display includes a grid which is adjustable so that the assessor can input the correct length of the wall by merely drawing a line on the screen using the grid to establish the desired length of the line.

Continuing the example, the assessor may build upon the exterior sketch when capturing interior room dimensions of a building on an assessed site. Whereas existing applications require the user to draw each room in full before proceeding to the next, in the disclosed invention sketching of the interior proceeds by measuring and sketching one wall at a time. It is not necessary to complete one room before beginning the next. Thus, larger areas can be drawn first, with additional interior walls added thereafter, dividing the area into smaller, distinct rooms as also seen in FIG. 3. When all rooms have been entered, the assessor will typically provide them with functional labels as seen in FIG. 4. Thereafter the system, at the election of the assessor, may analyze the sketch and provide a graphical display of the result, as seen in FIG. 5. The system may then also encode the pertinent information for transmission to a CAMA database, which transmission may occur immediately upon completion of the assessment or at a later time.

What is claimed is:

1. An apparatus for field assessment of static structure sites to provide data in a predetermined format acceptable to at least one taxing authority comprising a personal computing device, having a graphic display screen, a user interface and application software, said user interface being arranged to accept alphanumeric data provided by a user of the apparatus and also accept graphic inputs from the user representative of structural features of the static structure, said application software being arranged to provide a real-time display on said graphic display screen of dimensional data associated with the graphic inputs as they are entered by the user, said application software being arranged to cause said graphic inputs, which comprise segments of polygonal sections or subsections of said static structure, to be entered in any order, regardless of the completion of inputs of said segments of polygonal sections and subsections prior to initiating input of any other of said inputs of polygonal sections or subsections, said application software also being arranged to compute dimensional attributes of enclosed polygons resulting from the graphic input by the user, said application software providing output data in said predetermined format, said apparatus further comprising an electronic connection to an external system capable of receiving said output data in said predetermined format.

2. The apparatus of claim 1 wherein said predetermined format comprises a computer assisted mass appraisal (CAMA) format.

3. The apparatus of claim 1 wherein said graphic input comprises plural lines representing walls of the static structure.

4. The apparatus of claim 1 wherein said user interface comprises a stylus.

5. The apparatus of claim 3 wherein said software produces a sketch of the structure on the graphic display screen as the user enters said graphic input.

6. The apparatus of claim 5 wherein said software enables user-selected labels to be placed in any area of said sketch to display coded descriptive data strings for each structural element, representing the type of space drawn.

7. The apparatus of claim 3 wherein said software enables labels to be dragged from a portion of the display screen into the sketch.

8. The apparatus of claim 1 wherein said software is arranged to correct input errors of the user.

9. The apparatus of claim 5 wherein the sketch is provided in a color coded format.

10. The apparatus of claim 1 wherein said output data is transmitted to said external system by first transmitting said output data from said personal computing device to an intermediary computing system, said intermediary computing system then transmitting said output data to said external system.

11. The apparatus of claim 1 wherein said external system is a tax authority computer system.

12. The apparatus of claim 1 including a transmitter to transmit output data to said external system, said transmitter adapted to transmit said output data from said personal computing device to an intermediary computing system, and then to said external system.

13. A method of field assessment of static structure sites for generating data in a predetermined format acceptable to at least one taxing authority, said method comprising:

inputting into a computing apparatus at least one of alphanumeric and graphical data representing each of a plurality of segments of said static structure, said segments forming a polygonal representation of an entirety of said structure, said polygonal representation comprising one or more polygonal representations of component portions of said structure, the order of said inputting of said segments being unconstrained by a prior completion of any of said component portions;

generating said data in said predetermined format based upon said alphanumeric and/or graphical data; and outputting said data from said computing apparatus to said at least one taxing authority.

14. The method of claim 13 wherein generating data in the predetermined format comprises generating data in a computer assisted mass appraisal (CAMA) format.

* * * * *